METHOD OF MAKING A TRANSISTOR USING SEMICONDUCTIVE WAFER WITH CORE PORTION OF DIFFERENT CONDUCTIVITY

Filed Nov. 21, 1962

INVENTORS
PIETER J. W. JOCHEMS
LEONARD J. TUMMERS
REINIER DE WERDT
BY Frank R. Trifari
AGENT 3,305,411

METHOD OF MAKING A TRANSISTOR USING SEMICONDUCTIVE WAFER WITH CORE PORTION OF DIFFERENT CONDUCTIVITY

Pieter Johannes Wilhelmus Jochems, Leonard Johan Tummers, and Reinier de Werdt, Emmasingel, Eindhoven, Netherlands, assignors to North American Philips Company, Inc., New York, N.Y., a corporation of Delaware Filed Nov. 21, 1962, Ser. No. 239,310
Claims priority, application Netherlands, Nov. 30, 1961, 272,046
6 Claims. (Cl. 148—175)

The invention relates to a transistor comprising a wafer-shaped semi-conductor body having opposite emitter and collector regions of one conductivity type and a base region of the opposite conductivity type consisting of an active layer interposed between the emitter region and the collector region and produced by a local activating treatment, for example a diffusion treatment, of the emitter side of the wafer-shaped semi-conductor body, and of a portion surrounding and radially adjoining this layer for contact purposes, and to a method of manufacturing such a transistor.

The term "active layer of the base region" is used herein to signify in the usual manner the part of the base region substantially interposed between the emitter and collector regions and traversed by charge carriers which are emitted by the emitter region and collected by the collector region.

The term "a layer obtained by activating treatment of a surface of the semi-conductor body" is used herein to signify a layer obtained by epitaxial growing to this surface or, as mentioned hereinbefore, a layer obtained by diffusion into the said surface.

The term "an epitaxially grown layer" is used herein to signify in the usual manner a layer obtained by deposition of semi-conductor material from the vapour phase of this material or by decomposition from a compound in the vapour state containing the semi-conductor material, impurities being also deposited or diffused into the previously obtained layer.

One of the advantages of a diffused active base layer and of an epitaxial grown active base layer is that during manufacturing the thickness of such layers may be controlled easily. Especially when the thickness of the active layer must be small, for instance, a few microns for high frequency purposes, the said control of the thickness is important, which control improves the device's characteristics and its reproduction. An important method of making a diffused active base layer is the alloy-diffusion method, which is described in detail in the copending application, Serial No. 676,563, filed August 6, 1957.

The known transistors including an active layer of the base region of the said kind have a portion of the base region intended for the provision of contacts and having a thickness which, although it frequently exceeds the thickness of the active layer, still is of the same order of magnitude as that of the active layer, while in view of the use of the transistor at high frequencies this active layer is particularly thin (the thickness being, for example, a few microns). The base connection contact is provided on the still thin part of the base region intended for contacting purposes. Such transistors cannot readily be manufactured because the provision of the base connecting contact on so thin a layer provides difficulty. Furthermore such transistors still have a considerable base resistance due to the slight thickness of the part of the base region intended for contacting purposes. The base resistance may be restricted by providing the base connecting contact near the active layer of the base region and hence near the emitter region. However, provision of the base contact and the emitter contact (emitter region) in close proximity to one another provides technological difficulty and in addition during their provision they are liable to influence one another.

It is an object of the invention to provide a transistor of the kind described in the preamble which has a low base resistance and on which during manufacture the base contact may readily be provided at a greater distance from the emitter zone while retaining a low base resistance, and to provide a method of manufacturing such a transistor.

According to the invention a transistor of the kind mentioned in the preamble is characterized in that the part of the base region intended for contacting purposes extends over the entire thickness of the wafer-shaped semi-conductor body from the edge of the wafer-shaped semi-conductor body substantially up to the active layer of the base region, a distance preferably exceeding the thickness of the wafer-shaped semi-conductor body, a base connecting contact being provided on the said part. As a result a particularly satisfactory compromise with respect to the requirements for a low base resistance and a larger spacing between the base connecting contact and the emitter contact may be made while in providing the base connecting contact there is no likelihood of interfering with the part intended for contacting purposes, for example, by alloying through this part.

An important embodiment of the transistor in accordance with the invention is characterized in that between the diffused active layer of the base region and the collector region a further layer is provided having the same conductivity type as the base zone and a specific resistivity at least equal to that of the part of the diffused active layer adjoining the said further layer and at most equal to the intrinsic specific resistivity, whereas the part of the base region intended for contacting purposes has a specific resistivity lower than that of the said further layer. Hence the transistor in accordance with the invention has a low collector capacitance so that in operation in a circuit arrangement less trouble is encountered resulting from feedback.

It should be noted that the term "a layer of the same conductivity type as a previously mentioned layer and having a larger specific resistivity" includes an intrinsic layer.

The invention further provides a surprisingly simple method of manufacturing a transistor in accordance with the invention. According to the invention this method is characterized in that it starts from a wafer-shaped semi-conductor body including a rod-shaped portion extending transversely through the body and a portion surrounding the said rod-shaped portion, the concentration of charge carriers of the type which in the surrounding portion form the majority charge carriers being smaller in the rod-shaped portion than in the surrounding portion, after which the active layer of the base region, which layer adjoins the surrounding portion and is of the same conductivity type as this portion, is obtained by an activating treatment, for example a diffusion treatment, of an end face of the rod-shaped portion, the emitter zone being provided on the active layer. By starting from a wafer-shaped semi-conductor body of such configuration a particularly simple method of manufacturing a transistor having a thin active base layer obtained by diffusion or by epitaxial growth and a portion of the base region intended for contacting purposes which extends over the entire thickness of the wafer-shaped semi-conductor body, is obtained.

An important embodiment of the method in accordance with the invention is characterized in that one starts from a wafer-shaped semi-conductor body in which the said rod-shaped portion and the surrounding portion are of opposite conductivity types while at the end-face of the rod-shaped portion situated opposite the end face at which the active layer is formed a collector connecting contact is provided.

According to the invention another particularly important embodiment of the method of manufacturing a transistor in accordance with the invention of the kind mentioned hereinbefore having a further layer interposed between the active base layer and the collector region is characterized in that one starts from a wafer-shaped semi-conductor body in which the said rod-shaped portion and the surrounding portion are of the same conductivity type, the specific resistivity of the rod-shaped portion exceeding that of the surrounding portion and at most being equal to the intrinsic specific resistivity, while at the end face of the rod-shaped portion situated opposite the end face at which the active layer of the base region is formed a collector region is provided. This collector region may be obtained by a known alloying process. The manufacture of such a complicated transistor structure is particularly simplified by starting in accordance with the invention from a wafer-shaped semi-conductor body including a rod-shaped portion having the same specific resistivity as is desired for the further layer.

According to the invention the wafer-shaped semi-conductor body including a rod-shaped portion and a surrounding portion is manufactured by manufacturing a wafer-shaped semi-conductor body provided with masking layers on opposed major surfaces thereof, after which impurities of a particular conductivity type are diffused into the body throughout its entire surface area until only a rod-shaped portion of this body situated between the masking layers still has the initial concentration of impurities, after which the masking layers and, as the case may be, surrounding surface layers of the semi-conductor body are removed so that the portion having the initial concentration is exposed at the surface on both sides of the body.

The masking layers may simply be opposite raised parts of the semi-conductor body. In an advantageous embodiment of the method, the said raised parts are recrystallized semi-conductor layers.

Rod-shaped portions having proportions determined with a higher degree of accuracy and a greater reproducibility are obtained by using masking layers of silica.

In order that the invention may readily be carried into effect, embodiments thereof will now be described, by way of example, with reference to the accompanying diagrammatic drawings, in which:

FIGURES 1 and 2 are cross-sectional views of two different embodiments of transistors in accordance with the invention;

FIGURES 3, 4, 5 and 6 are cross-sectional views of successive intermediate stages of a method in accordance with the invention of manufacturing a transistor in accordance with the invention; while FIGURE 7 shows an intermediate stage of a semi-conductor body during another embodiment of the method in accordance with the invention.

Figures 1, 2, 3, 4, 5, 6, 7:
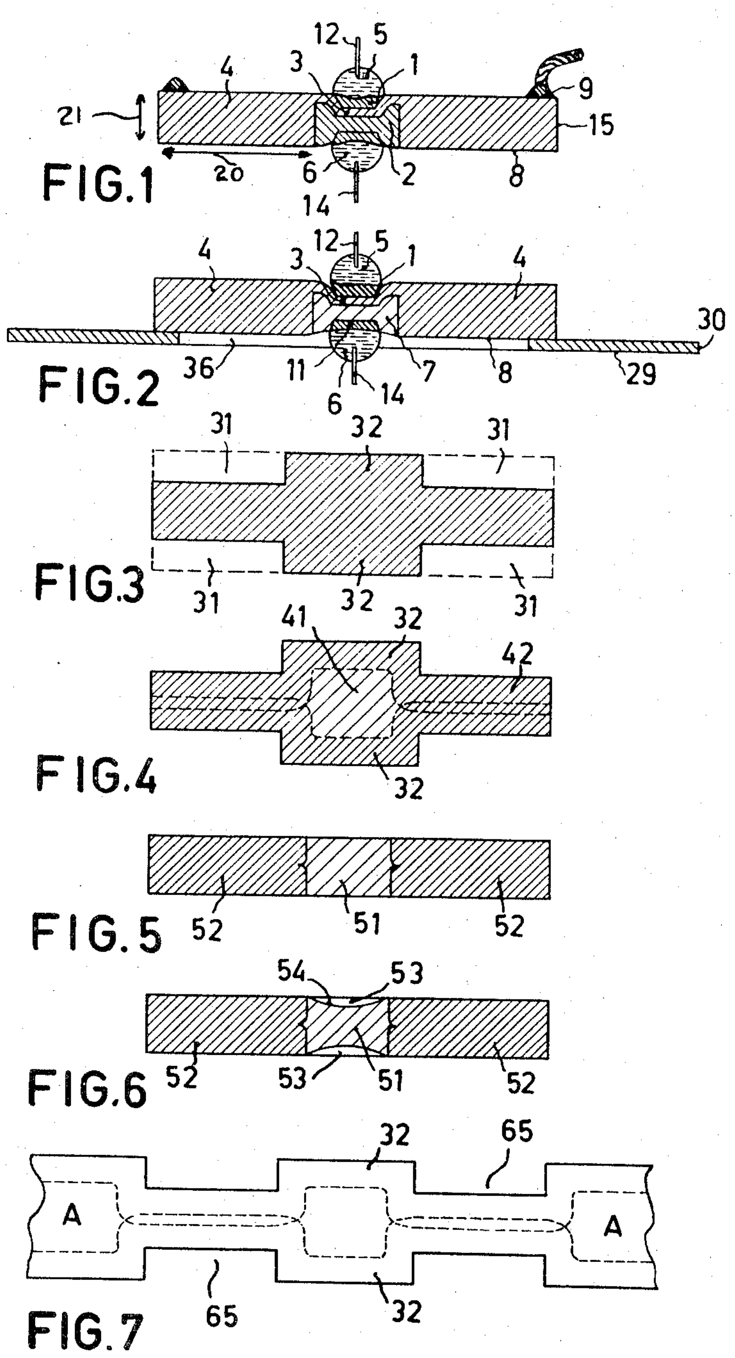

FIGURE 1 is a diagrammatic cross-sectional view of an embodiment of a transistor in accordance with the invention including a diffused active layer of the base region. The transistor comprises a wafer-shaped semi-conductor body 8 having an emitter region 1 of, for example, p-type conducivtity provided with an emitter contact 5 and a connecting lead 12, and a collective region 2 of the same conductivity type provided with a collector contact 6 and a connecting lead 14. The base region, which has a conductivity type opposite to that of the emitter and collector regions, that is to say, n-type conductivity in this example, comprises a thin diffused active layer 3 and a portion 4 for contacting purposes which surrounds this active layer and radially adjoins it. The portion 4 intended for contacting purposes extends over the entire thickness (see the arrow 21) of the wafer-shaped semi-conductor body 8 from the edge 15 of the wafer-shaped semi-conductor body 8 substantially up to the active layer 3 (see the arrow 20). Consequently, the base resistance is low. The distance indicated by the arrow 20 preferably exceeds the thickness indicated by the arrow 21. A base connecting contact 9, which may be an annular contact soldered to the wafer-shaped semi-conductor body 8, is spaced by a comparatively large distance from the emitter contact 5 and the emitter region 1 while retaining a low base resistance. The base and emitter connecting contacts are substantially prevented from influencing one another during their provision while the large thickness of the portion 4 intended for contacting purposes facilitates the provision of a base connecting contact. An advantage of having available the entire thickness of the region 4 for contacting purposes is, among other things, that alloyed connections can be employed without risk of penetrating through a surface region provided for contacting purposes.

In known transistors having a diffused active base layer, the portion intended for contacting purposes is too thin and frequently its area is too small to be connected to a contact which also serves as a support for the semi-conductor body. In these transistors the collector contact also serves as support for the semi-conductor body. In a transistor in accordance with the invention, the portion 4 of the base region intended for contacting purposes is very suitable for connection to a contact which also serves as support. This contact may be a metal plate 29 which is provided with an aperture 36 (FIGURE 2) and along this aperture is connected to the semi-conductor body 8, for example, by soldering in a manner as shown in FIGURE 2. (In the transistors shown in FIGURES 1 and 2 corresponding parts are designated by the same reference numerals.) This construction has the advantage which is especially important when the transistor is used at high frequencies, that with grounded base the contacts 5 and 6 and the connecting leads 12 and 14 are capacitatively screened from one another. This screening may be further improved by securing the metal plate 29 along its rim 30 to the inner surface of a tubular metal envelope, for example, by clamping or soldering.

A transistor in accordance with the invention as shown in FIGURE 2 includes a further layer 7 interposed between the diffused active layer 3 and the collector region 11. This layer 7 is of the same conductivity type as the layer 3 and has a specific resistivity at least equal to that of the portion of the layer 3 adjoining the layer 7 and at most equal to the intrinsic specific resistivity. The term "intrinsic specific resistivity" is used herein to signify in the usual manner the specific resistivity in a semi-conductor in which the concentrations of both types of charge carriers are equal. Due to this layer 7 the collector capacitance is small so that when the transistor is used in an electric circuit arrangement less trouble is encountered from feedback.

Embodiments of a method in accordance with the invention of manufacturing the abovementioned transistors will now be described while further details of these transistors will be given.

According to the invention a wafer-shaped semi-conductor body provided with masking layers on opposite surfaces is manufactured. By subjecting this body to a diffusion treatment throughout its surface area the concentration of impurities in the body with the exception of a rod-shaped part situated between the masking layers is altered. The masking layers are then removed so that the said rod-shaped part is exposed at the surface on both sides.

To manufacture a transistor as shown in FIGURE 1 one may start from a wafer-shaped semi-conductor body, for example, of p-type germanium having a thickness of 220 microns and a specific resistivity of about 1 ohm-cm. From both sides of the wafer a surface layer 31 of thickness about 60 microns is removed except at two areas situated opposite one another on either side of the wafer (FIGURE 3). This may be effected by grinding, selective etching or ultrasonic boring. The wafer then has a cross-sectional area as shown by shading in FIGURE 3 with opposite raised parts 32. These raised parts 32 serve as masking layers. The diameter of the plate may be about 1 mm., its thickness 100 microns, the height of the opposed raised parts 60 microns and the diameter of these raised parts 180 microns.

In another advantageous embodiment of the method in accordance with the invention the raised parts 32 may be masking recrystallized semi-conductor layers. These layers may be obtained by alloying a material consisting of germanium and at least one metal to the wafer-shaped germanium body and subsequently cooling. The proportion of germanium in the alloy material must be such that substantially no material of the semi-conductor body is dissolved in the alloyed material while on cooling a sufficiently thick recrystallized germanium layer is obtained. On this recrystallized layer is disposed the metal of the alloy which subsequently is removed. A slight amount of the metal of the alloy is also crystallized out in the recrystallized layer. In the diffusion treatment described hereinafter it is usually undesirable that also impurities are diffused from the raised parts into the semi-conductor body, although in certain cases to achieve a local change in the impurity concentration of the semi-conductor body a small degree of diffusion from a raised part may be desirable. However, the said alloy preferably contains no rapidly diffusing active impurities. The alloy may contain one or several of the metals indium, aluminum, gallium, lead and tin. To obtain a raised part 32 a pellet having a diameter of 18 microns and consisting of indium containing 60 atomic percent of germanium may be alloyed to the semi-conductor body in a hydrogen atmosphere at a temperature of 820° C. Cooling to room temperature is then effected in about half an hour. A recrystallized germanium layer (in the form of a raised part 32) having a thickness of about 60 microns and a diameter of about 180 microns is then produced. A small amount of indium is disposed on this layer. This indium is removed by etching with a solution of HCl (10%) in water.

n-Type impurities, for example antimony are then diffused into the entire surface area of the wafer provided with raised parts 32, for example, to a depth of about 55 microns. The resulting configuration is shown in FIGURE 4. The broken lines indicate the diffusion boundaries. Only a rod-shaped portion 41 of the plate situated between the raised parts 32 still is of p-type conductivity while the remainder 42 of the wafer has become n-type.

The diffusion of antimony may be effected in a furnace which may consist of quartz and in which a hydrogen atmosphere is maintained containing antimony vapour. The diffusion is performed at 820° C. for about 18 hours. After the diffusion treatment the surface concentration of antimony atoms is from about $10^{18}$–$10^{19}$ atoms per cc.

The raised parts 32 and if necessary surrounding surface layers are then removed so that the configuration shown in FIGURE 5 is obtained. The raised parts may simply be removed by grinding. The resulting configuration comprises a rod-shaped portion 51 of p-type conductivity and a portion 52 of n-type conductivity surrounding the rod-shaped portion.

After the grinding operation the wafer is etched electrolytically, for example, in an aqueous 40% solution of KOH. For this purpose a conductor is secured at one side of the wafer to an end face of the rod-shaped portion 51 with the aid of silver paste after which this side of the wafer and the conductor are coated with an insulating lacquer. The other side of the wafer is etched in the etching bath. Between the said conductor and a platinum electrode arranged in the bath a voltage is applied causing a current of, for example, a few ma. Etching is performed for about 10 seconds. The p-type rod-shaped portion 51 is etched at a higher rate than the surrounding n-type portion 52 so that at the area of the rod-shaped portion 51 a recess is produced in the surface of the wafer. The other side of the wafer is etched in the same manner. The lacquer and the silver paste may be removed by dissolving in acetone. The resulting configuration is shown in FIGURE 6, the recesses 53 marking the position of the rod-shaped portion 51. After the etching process the wafer is washed in deionized water and then dried.

According to another important embodiment of the method in accordance with the invention a wafer-shaped semi-conductor body, for example, of germanium, is not provided with the above-described raised parts but with masking layers of silica. A masking silica layer may be readily obtained by deposition from the vapour phase, for example, with the use of a separate masking plate provided with at least one aperture. The masking plate may be a molybdenum plate of thickness about 100 microns having a circular aperture made, for example, by drilling and having a diameter of about 180 microns. The masking plate is arranged on the semi-conductor body and the assembly is arranged in a device for deposition from the vapour phase in which a vacuum is maintained. The device also contains an amount of solid silica which is heated to a temperature of about 1000° C. while the temperature of the semi-conductor body is raised to about 300° C. The spacing between the solid silica and the semi-conductor body is about 10 cms. The silica vaporizes and is deposited on the molybdenum plate and, through the aperture, on the semi-conductor body. The process is continued until a silica layer having a thickness of approximately from ½ to 1 micron is produced on the semi-conductor body.

After the desired masking layers have been provided in this manner, the body is subjected to a diffusion treatment throughout its entire surface area in the manner described in the preceding example and subsequently the silica layers are removed by etching with hydrofluoric acid. The resulting configuration is shown in FIGURE 5. By etching in a manner as described in the preceding example a configuration as shown in FIGURE 6 is obtained.

In a further advantageous embodiment of the method in accordance with the invention, masking silica layers are provided on a wafer-shaped semi-conductor body with a high degree of accuracy by a photographic process. The semi-conductor body may be entirely coated with a layer of silica and subsequently the layer may locally be removed with the aid of a photographic process. However, the semi-conductor body is preferably first coated with a photo-hardening lacquer.

The term "photo-hardening lacquer" is used herein to signify in the usual manner a lacquer which is also referred to as "photo-resist" and is soluble in a suitable developing liquid before irradiation but not after irradiation. (The irradiation need not necessarily be effected with visible light.) Such lacquers together with associated developing liquid are commercially available.

After the lacquer has been deposited on the semi-conductor body it is exposed with the exception of the areas at which the masking layers are to be provided and subsequently the unexposed portions of the lacquer are removed with the aid of a developing liquid. Subsequently a silica layer is deposited from the vapour phase in the manner described hereinbefore. This layer adheres satisfactorily to the semi-conductor body at the areas from which the photo-hardening lacquer has been removed, but is readily removed by brushing from the other areas together with the residual photo-hardening lacquer. As has been described hereinbefore, the configuration shown in FIGURE 6 may then be obtained by subjecting the assembly to diffusion throughout its surface area, removing the masking oxide layers and etching. However, to obtain accurately defined recesses 53 the latter are preferably produced by electrolytic etching after the development of the photo-hardening lacquer and before the provision of the oxide layer.

The electrolytic etching process may be performed by cementing a glass tube, for example, with nitrocellulose lacquer to a surface of the semi-conductor body so that the tube is closed at one end by the semi-conductor body. The tube is filled, for example, with mercury into which an electric connecting lead is inserted. The mercury is in contact with the semi-conductor body at the areas at which the photo-hardening lacquer has been removed. The semi-conductor body is immersed in an etching bath so that the tube projects above the etching liquid. The etching liquid may be an aqueous 40% solution of KOH. Between the said connecting lead and a further electrode arranged in the etching bath a voltage is applied so that a current of a few ma. starts to flow. The surface of the semi-conductor body opposite the tube is etched at the areas from which the photo-hardening lacquer has been removed so that recesses are produced. Etching is performed for about 10 seconds.

It should be noted that the recesses 53 are not essential to the invention but by providing these recesses 53 one has an easy method to indicate the location of the rod-shaped region 51.

After the etching treatment the masking oxide layers are provided, the body is subjected to a diffusion treatment throughout its surface area and the oxide layers are again removed so that the configuration shown in FIGURE 6 is obtained.

By the use of masking layers of silica more accurately proportioned rod-shaped portions may be produced in the semi-conductor body than by the use of the above-described raised parts. In addition the reproducibility is imporved.

The body having a configuration as shown in FIGURE 6 is then provided with the active layer of the base region. This layer, the emitter region and the emitter contact may simply be obtained by alloying a pellet having a diameter of about 60 microns consisting, for example, of lead containing 2% by weight of antimony and 0.5% by weight of gallium to an end face 54 of the rod-shaped part 51 in a recess 53 (FIGURE 6) at a temperature of about 780° C. in a hydrogen atmosphere for about 10 minutes. By predominant diffusion of the antimony an active n-type layer 3 (FIGURE 1) of thickness a few microns is produced and by predominant segregation of the gallium a p-type recrystallized emitter region 1 is produced on which a solidified amount of electrode material 5 is disposed. During alloying there evaporates some antimony and it is supposed that antimony vapour diffuses into the end face 54 around the pellet 5 forming a diffused bridge region between the diffused base region and the surrounding region 4. A collector contact 6 is provided on the side opposite the emitter region 1 and the active layer 3, for example, by alloying a pellet having a diametter of $60\mu$ and consisting of indium containing ½% by weight of gallium to the semi-conductor body at a temperature of about 550° C. in a hydrogen atmosphere for about 5 minutes.

After the provision of the active layer 3 and the emitter region 1 the resulting assembly may be etched in a usual manner and this may be repeated after the provision of the collector contact 6.

The connection leads 12 and 14, which may be nickel wires, may be provided in a usual manner while the base connecting contact, which may consist of a nickel wire 9 or of an apertured nickel plate 29 (FIGURE 3), may be joined to the portion 4 intended for contacting purposes by soldering, for example, with a lead tin solder to which antimony has been added.

The transistor described with reference to FIGURE 2 in which the layer 7 is of the same conductivity type as the base region comprising the portions 3 and 4 or, as the case may be, is intrinsic, may be manufactured substantially in the same manner as described hereinbefore with respect to a transistor of the kind shown in FIGURE 1. The whole difference consists in that one does not start from a wafer-shaped body of p-type conductivity but from a body of n-type conductivity having a specific resistivity exceeding, for example, 10 ohm cm. or even from an intrinsic body.

It will be appreciated that the invention is not restricted to the embodiments of transistors in accordance with the invention and the embodiments of a method in accordance with the invention described hereinbefore. Many variations will suggest themselves to one skilled in the art without departing from the scope of the invention. For example, the collector contact 6 (FIGURE 1) may be provided after a large part of the layer 2 has been removed by etching so that the spacing between the collector contact 6 and the layer 3 is decreased and the collector series resistance is reduced. Furthermore the active layer 3 of the base region (FIGURES 1 and 2) may be separately obtained by diffusion or epitaxial growth from the vapour phase and subsequently the emitter contact may be alloyed to the diffused layer in a separate operation. The semi-conductor body which is subjected to diffusion throughout its entire surface area (FIGURES 3 and 4) may be shaped in the form shown in cross-section by FIGURE 7. In this event the semi-conductor body is wafer-shaped and provided with annular opposite grooves 65 and with raised parts 32. The grooves are readily obtainable by ultrasonic boring. After diffusion and removal of the marginal parts A a body is obtained as shown in FIGURE 4. This method is highly suitable for mass manufacture because in a large sheet of semi-conductor material many pairs of opposite annular grooves may be provided and subsequently by subdivision of the sheet and diffusion many bodies of the kind shown in FIGURE 4 may be obtained. Alternatively a sheet of semi-conductor material may be provided with a number of pairs of opposite masking layers consisting of silica, enabling a plurality of transistors to be made from a sheet of semi-conductor material. Furthermore wafer-shaped semi-conductor bodies including a rod shaped portion and a surrounding portion may be obtained by subjecting a rod of semi-conductor material to diffusion throughout its entire surface area until only the core of the rod still has the initial concentration of impurities, after which the rod is cut into wafers, or by subjecting a rod of semi-conductor material to a floating zone treatment in which by the use of annular molten zones only the core of the rod retains the initial composition, after which the rod is cut into wafers. Semi-conductor materials other than germanium, for example, silicon and $A_{III}B_{V}$ compounds, may be used, as may impurities and electrode materials other than the above mentioned ones.

We claim:

1. A method of making a transistor comprising the steps of providing a wafer-shaped semiconductive body of one conductivity type with opposed major surfaces, providing opposite one another on the major surfaces masking layers capable of inhibiting the diffusion of active impurities into a body portion located between the masking layers, thereafter diffusing into the entire body except for the body portion protected by the masking layers active impurities forming the opposite conductivity type semi-conductor to convert the entire wafer except for a generally rod-shaped interior portion surrounded thereby to the opposite conductivity type material having a conductivity value substantially greater than that of the rod-shaped interior portion, the concentration of charge carriers in the surrounding body portions of opposite conductivity type of the type which form therein the majority charge carriers being greater than the concentration of said charge carriers in the interior rod-shaped portion, epitaxially depositing a layer on the rod-shaped portion and providing therewithin active impurities forming the said opposite conductivity type semiconductor to convert a surface portion thereof to the said opposite type conductivity connected to the surrounding body portions to produce a base region, forming an emitter region of said one conductivity type on the said base region, providing a collector connecting region of said one conductivity type at the opposite exposed surface of the rod-shaped portion, contacting the emitter and collector regions, and contacting the surrounding body portions to effect an electrical connection to the base region.

2. A method of making a transistor comprising the steps of providing a wafer-shaped semiconductive body of one conductivity type with opposed major surfaces, providing opposite one another on the major surfaces masking layers capable of inhibiting the diffusion of active impurities into a body portion located between the masking layers, thereafter diffusing into the entire body except for the body portion protected by the masking layers active impurities forming the opposite conductivity type semiconductor to convert the entire wafer except for a generally rod-shaped interior portion surrounded thereby to the opposite conductivity type material having a conductivity value substantially greater than that of the rod-shaped interior portion, the concentration of charge carriers in the surrounding body portions of opposite conductivity type of the type which form therein the majority charge carriers being greater than the concentration of said charge carriers in the interior rod-shaped portion, thereafter exposing opposite surface portions of the rod-shaped interior portion by removing intervening materials, diffusing into an exposed surface portion of the rod-shaped portion active impurities forming the said opposite conductivity type semiconductor to convert a surface portion thereof to the opposite type conductivity connected to the converted surrounding body portions to produce a base region, forming an emitter region of said one conductivity type on the said base region, forming a collector region of said one conductivity type at the opposite exposed surface of the rod-shaped portion, contacting the emitter and collector regions, and contacting the connected surrounding body portion to effect an electrical connection to the base region.

3. A method as set forth in claim 2 wherein the masking layers comprise raised portions of the semiconductive body integral with the remainder of the body, said raised portions being removed to expose the rod-shaped interior portion.

4. A method as set forth in claim 3 wherein the raised portions are formed by alloying an alloy mass containing at least one metal and the material of the semiconductive body to opposed portions of the semiconductive body to form recrystallized regions underneath the mass, and then removing the mass leaving the recrystallized regions.

5. A method as set forth in claim 2 wherein the masking layers are of silica, which is removed by etching after the diffusion treatment.

6. A method as set forth in claim 5 wherein the silica is deposited on the wafer from the vapor phase.

References Cited by the Examiner

UNITED STATES PATENTS

| | | | |
|---|---|---|---|
| 2,796,562 | 6/1957 | Ellis | 148—187 |
| 2,802,760 | 8/1957 | Derick | 148—189 |
| 2,840,494 | 6/1958 | Parker | 148—175 |
| 2,840,497 | 6/1958 | Longini | 148—33.5 |
| 2,940,023 | 6/1960 | Nannichi | 317—235 |
| 2,941,131 | 6/1960 | Williams | 317—235 |
| 2,947,923 | 8/1960 | Pardue | 148—189 X |
| 2,952,824 | 9/1960 | Pearson | 148—177 X |
| 2,975,080 | 3/1961 | Armstrong | 148—189 |
| 2,975,342 | 3/1961 | Rediker | 148—177 X |
| 3,089,793 | 5/1963 | Jordan | 148—187 |
| 3,108,914 | 12/1963 | Hoerni | 148—186 |
| 3,164,498 | 1/1965 | Loeb | 148—175 X |
| 3,164,500 | 1/1965 | Benda | 148—186 |

FOREIGN PATENTS

| | | |
|---|---|---|
| 765,190 | 1/1957 | Great Britain. |

HYLAND BIZOT, *Primary Examiner.*

DAVID L. RECK, BENJAMIN HENKIN, *Examiners.*

H. W. CUMMINGS, *Assistant Examiner.*